United States Patent [19]

Newland

[11] Patent Number: 4,590,710

[45] Date of Patent: May 27, 1986

[54] SEAL FOR A SHIELDING ENCLOSURE WITH OPENING

[76] Inventor: James F. Newland, 18800 Mountain Dale Ct., Newhall, Calif. 91321

[21] Appl. No.: 661,432

[22] Filed: Oct. 16, 1984

[51] Int. Cl.$^4$ ................................................ E06B 7/16
[52] U.S. Cl. ........................................ 49/478; 49/278; 49/485; 174/35 MS; 174/35 GC
[58] Field of Search ................ 49/478, 278, 276, 485; 174/35 MS, 35 GC

[56] References Cited

U.S. PATENT DOCUMENTS

| | | | |
|---|---|---|---|
| 1,290,283 | 1/1919 | Mitchell | 49/278 X |
| 2,659,115 | 11/1953 | Anderson et al. | 49/478 X |
| 3,260,788 | 7/1966 | Stetson | 174/35 GC |
| 3,691,688 | 9/1972 | Kaiserswerth | 49/485 X |
| 3,969,572 | 7/1976 | Rostek | 174/35 MS |
| 4,011,688 | 3/1977 | Geiss | 49/276 X |

*Primary Examiner*—Philip C. Kannan
*Attorney, Agent, or Firm*—Frank L. Zugelter

[57] ABSTRACT

A seal assembly for an enclosure, which attenuates or eliminates frequencies through the enclosure, and including a non-magnetic electrical conducting membrane on a door frame to which the door seals. Also, means for opening the door from either of its sides which means do not cause any frequency leakage through the door in its closed mode. The membrane is formed in segments, one of which is contiguous to and engages a magnetic member disposed in a pocket formed in the door assembly. Other segments constitute resilient formations in the membrane and by which the magnetic member resiliently receives the door upon its engagement therewith. The opening mechanism mounted on the door to each of its sides engages corresponding door frame elements to cause the door to be opened without in any way preventing the door from completely sealing with the door frame in its closed mode.

11 Claims, 11 Drawing Figures

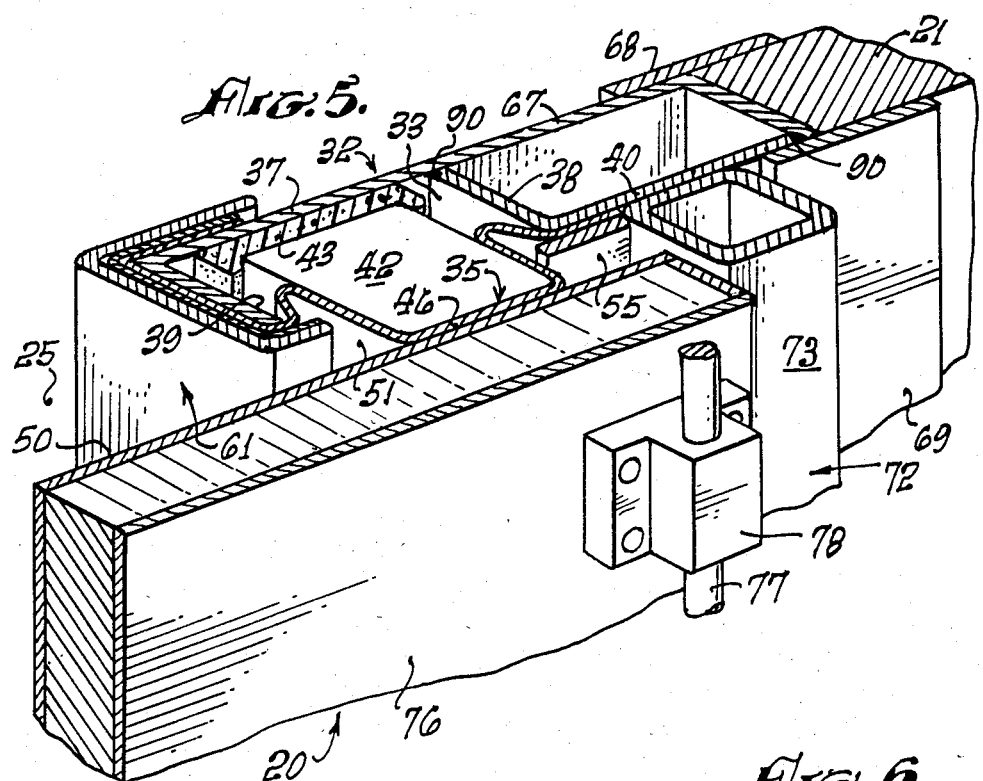
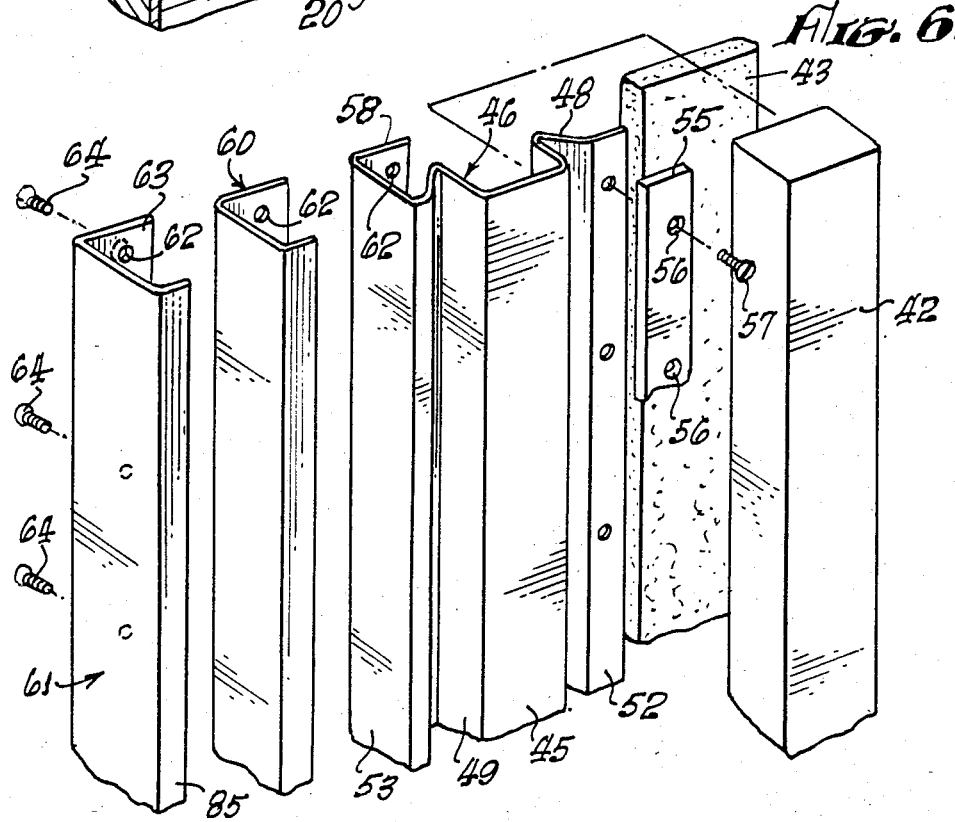

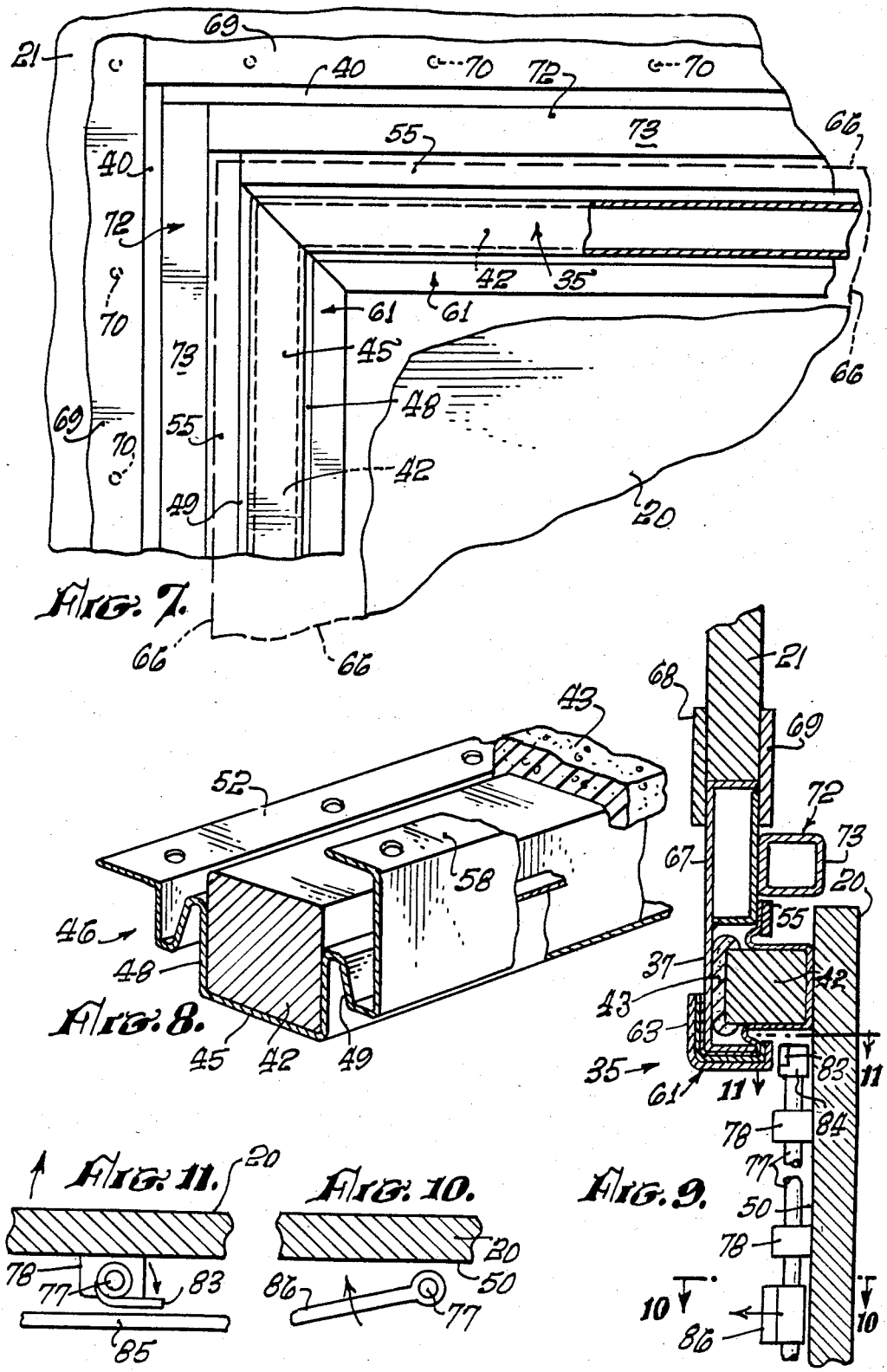

SEAL FOR A SHIELDING ENCLOSURE WITH OPENING

TECHNICAL FIELD

This invention is directed to attenuation of the loss of frequency leakage through shielding enclosures, particularly as to leakage occurring between enclosure and door therefor, and is particularly directed to a unique, distinct seal assembly in a door frame mounted in an opening of the enclosure, whereby loss of leakage attenuation never before realized is achieved, and to means for opening the door or breaking from the seal mounted to each side or leaf of the door.

BACKGROUND ART

See: U.S. Pat. Nos. 2,659,115; 3,260,788; 3,691,688; 3,821,463; 3,889,043; 3,969,572; 4,011,688; and 4,069,618.

DISCLOSURE OF THE INVENTION

A. Background

Shielding enclosures are utilized for anechoic chambers, communication facilities, mobile communications, computer facilities, test units, securement-of-conference-room communications, and the prevention or regulation of electrical and other signals in the atmosphere or space.

The computer and electronics industries, the medical field and government are prime examples of areas of concern which utilize shielding enclosures and systems.

An opening is needed in each enclosure for ingress and egress by personnel to and from the enclosure's chamber. Thus, an effacacious sealing mode between the enclosure's wall and door must be achieved in order to prevent leakage of any radio-frequency or electromagnetic radiation out of or into the enclosure. In constructing and assembling these systems, each is built to a particular specification desired by the user for a given range or ranges of signals, as in reality, leakage does occur. Thus, the specification is drawn to meet a maximum of leakage allowed in a particular constructed system. The performance of meeting such leakage maximum is measured by the attenuation of a loss of leakage for a given constructed or built enclosure or system.

B. Problems in the Prior Art

State-of-the-art enclosures and door systems have various disadvantages. For example, one known construction, FIG. 4, more fully disclosed in U.S. Pat. No. 4,069,618, utilizes flexible metal fingers mounted in a door frame and which engage a door channel member in a closure mode. Practice shows that the fingers are subject to corrosion, high cost maintenance, misalignment with and sagging in the channel member. Other state-of-the-art enclosures have been found to be subject to abrasion on mating surfaces of door leaf to seal, high door weight disadvantages, breakage of components mechanically fastened to the door, warping of doors over a period of time which cause wear out, all of which has lead to inconsistent or poor attenuation performance of leakage loss in shielding enclosures and systems.

C. Advantages of This Invention

This invention provides for consistent attenuation a loss of leakage for a given construction not heretofore realized in shielding systems. The effacaciousness of the invention cannot be fully measured by available existing testing equipment. For example, embodiment of this invention provides at least or more than a 135 db (decibel) attenuation at 400 MHz frequency in the electrical field. Also, at 1 KHz frequency in the magnetic field, a 56 db attenuation occurs, which is a 250% increase in performance over previous shielding doors. The most important advantage is the elimination of leakage across the mating surfaces of the seal assembly and the door leaf, which in other words, is significantly improved performance of attenuation at all levels.

Other advantages of this invention will become apparent. Fo example, solder, which breaks down in time thereby providing for leakage, as well as fingerstock is eliminated. No mechanical fastening means between enclosure and door is required, thereby eliminating breakage of constructed components. Sagging and misalignment of the door is eliminated. No abrasion of mating surfaces of seal assembly and door leaf occurs. The weight of the door and its added components is lightened by the elimination of hardware. A wider opening for a door is possible, with a honeycombed core for the door, used in the practice of the subject matter of the invention. The operating mechanism to open the door provides conformance to fire regulations. There is less susceptibility to damage because of a human factor. The door automatically seals upon closing, without the need for operation of a handle and its mechanisms to do the same, as a consequence of the unique construction of the seal assembly in this invention.

BRIEF SUMMARY OF THE INVENTION

The seal of this invention is assembled in a pocket formed in a frame member secured to an enclosure wall about an opening therein. A non-magnetic electrical-conducting membrane is mounted in the pocket, over a magnetic member which attracts the door's metallic nature against the membrane when the door overall is in close proximity to the frame. The membrane includes a first segment contiguously mounted to a face of a magnet, a pair of spaced second segments constituting resilient formations in the membrane attached to opposing edges of the first segment, and third and wrap-around segments for securement to the frame member, all of these segments integrally formed of the membrane. The door closes and its leaf seals upon the first segment, the resilient formations providing for movement of membrane and magnet upon shock of closure and against a foam rubber member seated in the pocket's bottom for absorbing such shock. Membrane and magnetic members extend completely around or along the length of the door frame.

Means for opening the door from its sealing mode is provided on each door leaf, interiorly and exteriorly of the enclosure. Actuation of an eccentric cam and ear, affixed to a shaft having a pull-handle by which it rotates in pillow blocks secured to the exterior door leaf, against the door frame, breaks the magnetic member's force mating the first segment and door leaf. Interiorly of the enclosure, likewise a shaft and eccentric cam and ear are mounted via pillow blocks to the interior door leaf, with a push-handle causing rotation of shaft, cam and ear. However, in this instance the cam works against a clip member or other element mounted on the door frame to force the door outwardly and against the magnetic member's forces producing the mating of door to seal assembly.

OBJECTS OF THE INVENTION

An object of this invention is to provide a novel and distinct seal assembly for a shielding enclosure.

Another object of this invention is to provide a novel and distint door frame assembly.

A still further object of this invention is to provide a novel and distinct shielding enclosure or system.

A further object of this invention is to drastically and unexpectedly reduce leakage across the seal between door and door frame in an enclosure's opening.

A further object of this invention is to achieve attenuation of leakage never heretofore realized in the construction and assembly of a shielding enclosure or system.

A still further object of this invention is to produce a consistently high performance or attenuation of loss of leakage between enclosure and door, over the life for the shielding enclosure or system.

Another object of this invention is to eliminate a fragile nature for components which tear, break or wear out in cyclical use of the enclosure's door.

These and other objects, and advantages, will become apparent upon a complete and full reading of the following description, appended claims thereto, and accompanying drawing comprising three (3) sheets of FIGURES.

BRIEF DESCRIPTION OF THE DRAWING

FIG. 5 is an enlarged fragmentary perspective view of subject matter of the invention, taken in the general location of line 5—5 of FIG. 1.

FIG. 6 is an exploded fragmentary perspective view of a non-magnetic electrically-conducting membrane and a magnetic member utilized in the invention.

FIG. 7 is an elevational view of the invention as adapted to the juncture of frame members in which the seal assembly resides.

FIG. 8 is a perspective fragmentary view of the membrane and magnet utilized in the invention.

FIG. 9 is an elevational view, partly in section, showing a linkage attached to the door's side opposite its swing side, such linkage's actuation pushing the door open and away from magnetic forces keeping the door closed.

FIG. 10 is a view taken on line 10—10 of FIG. 9.

FIG. 11 is a view taken on line 11—11 of FIG. 9.

DESCRIPTION OF CONTEMPLATED BEST MODE OF THE INVENTION

Figure 1:
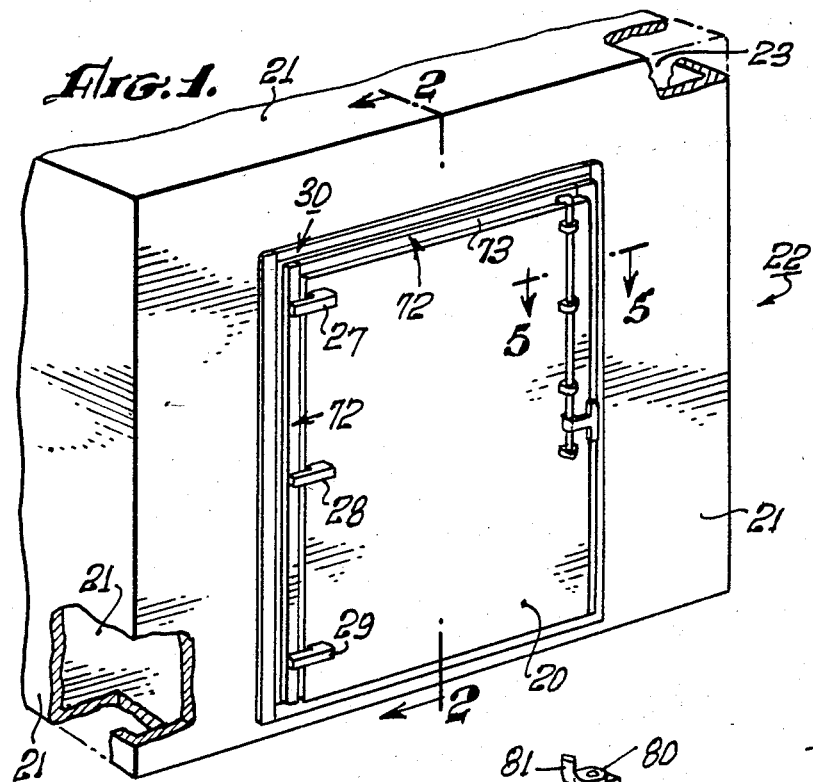
FIG. 1 is a perspective view of assembled subject matter incorporating the invention, upon a wall of a shielding enclosure forming a chamber.
Figure 3:
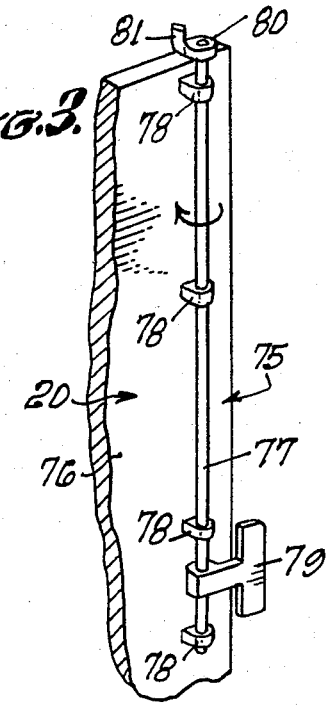
FIG. 3 is a perspective view of a linkage attached to the swing side of a shielding enclosure's door to open it away from magnetic forces keeping the door closed.
Figure 4:
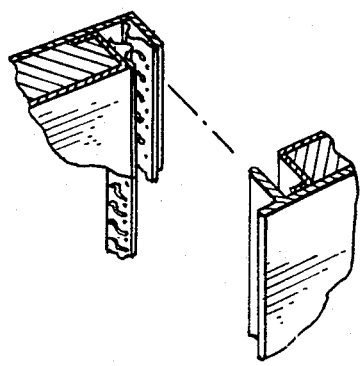
FIG. 4 is a perspective view of a prior art teaching.
Figure 2:
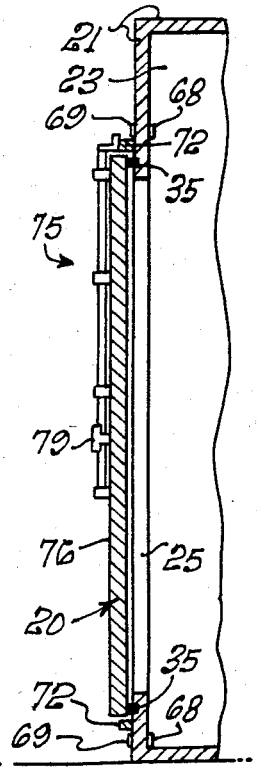
FIG. 2 is a diagrammatic view, taken on line 2—2 of FIG. 1.

Referring now to the drawing, wherein reference characters therein correspond to like numerals hereinafter, a door 20, FIGS. 1, 5, is mounted upon a wall 21 of a series of walls forming a completely contained self-enclosure 22, an example of which being a cube-shaped one, and having a chamber 23 therein. FIG. 2 discloses the mounting of door 20 to and exteriorly of an enclosure opening 25, FIG. 5, for enclosure 22, with its swing side directed exteriorly of the enclosure. Hinges 27, 28, 29, shown in block form, FIG. 1, provide the means by which door 20 swings upon its door frame 30. It should be understood that such hinges are made in accordance with state-of-the-art teachings not necessary to describe here, but nevertheless to point out that such teachings do carry out the function of swinging door 20 to and from its closed and sealed mode. Door frame 30 is secured to wall 21 within enclosure opening 25, and comprises a plurality of frame members 32, FIG. 5, operatively joined together, each of such frame members 32 including a pocket 33 in and about which the seal 35 of the present invention is disposed.

The following description is directed to seal 35 mounted in door frame member 32 of the door frame 30. It is to be understood that such seal 35 is mounted or disposed in all frame members, and is operatively joined with one another at the juncture, FIG. 7, of frame member to frame member.

Each frame member 32, FIG. 5, includes pocket 33 formed by a base 37 and a pair of spaced walls 38, 39 joining base 37. A flange 40 is joined to wall 38 at one edge or end of frame member 32. A magnetic member 42 is mounted in pocket 33 upon a resilient absorbing element 43, such as foam rubber, seated on base 37, and extends throughout the length of frame member 32. A first segment 45, FIGS. 5, 6, 8, of a non-magnetic electrically-conducting membrane 46, extending likewise throughout the length of frame member 32, is disposed continuously along a face of magnetic member 42. Membrane 46 includes spaced second segments 48, 49 integrally formed to such first segment 45, and which extend toward base 37 at the bottom of pocket 33. These second segments 48, 49 constitute resilient formations included in membrane 46, the action of which not preventing establishment of a mating seal between first segment 45 and a leaf 50 of door 20 upon the latter's closing across an opening 51 of pocket 33. In other words, the engagement of membrane 46 with door 20 lies in a plane exteriorly of the opening 51 of pocket 33.

Additional segments 52, 53 FIGS. 6, 8, are integrally formed upon resilient formations 48, 49, respectively, in order to secure membrane 46 to frame member 32. Segment 52 is shown in FIG. 5 through not referenced, as mounted on flange 40 at the one edge or end of frame member 32. A flat metal bar 55, FIGS. 5, 6, 7, mounts on segment 52 and includes holes 56 for screws 57 to secure it and segment 52 to flange 40. The other segment 53 is wrapped around wall 39 at the other edge or end of frame member 32, and includes a terminal flap 58 which lies flush upon the exterior surface of base 37. A first copper clip member 60 and then a (second) steel clip member 61 moounted thereover, are mounted upon such wrap-around segment 53, best seen in FIGS. 5, 6, and with elements 60, 58, includes holes 62 in its terminal flange 63 and such elements, for screws 64 to secure them all to base 37 (having corresponding threaded holes, not shown), and thereby retain membrane 46 in secured position across opening 51 of pocket 33.

Referring now to FIGS. 5, 7, the manner of connection of frame members 32 to wall 21 and of seal 35 to seal 35 across the juncture of adjacent frame members 32 is shown. Door 20 is broken away by phantom line 66, FIG. 7, to reveal an assembled juncture of frame member to frame member and seal assembly to seal assembly. Flange 40 is one of two spaced flanges 40, 67, FIG. 5, developed in the fabrication of each frame member 32. Their spacing is that of the depth of wall 21 which abuts their edges, FIG. 5. A pair of rigid, flat metal straps 68, 69, extending substantially the length of each frame member 32, are correspondingly mounted across each surface of wall 21 and correspondingly across flanges 40, 67, FIG. 5. Bolts 70, shown in phantom in FIG. 7, are utilized to compress together straps 68, 69 against wall 21 and flanges 40, 67, thereby supporting and securing door frame member 32 and the door frame 30 itself in opening 25 of enclosure 22. These compression bolts 70 pass through strap 68 and wall 21, to be threaded in conventional channelled threaded brackets (not shown) suitably secured on the interior side of strap 69. The end of each strap 68, 69 to each side of door 20 and door frame member 32 abuts an edge of a corresponding strap 68, 69 in the adjacent frame member, FIG. 7. A metal tubing 72 is suitably bolted (not shown) to flange 40 to provide, in addition to the mounting of hinges 27, 28 and 29 (FIG. 1) thereto, a surface 73 disposed outside the door's length and width dimensions and against which a linkage 75, FIGS. 2, 3, 9–11, operates to open door 20 from a position exterior to enclosure 22, such linkage 75 hereinafter more fully described. Tubing 72 abuts tubing, from one frame member to the next, FIG. 7. Likewise, each flat bar or strip 55 abuts its adjoining one in the next frame member 32, FIG. 7. Each membrane 46, along with clip members 60, 61, is mitered at each juncture and joined together from one frame member to the next adjacet frame member at such miter.

It is to be understood that in order to maintain continuity of communication of pockets 33 from one frame member to the next, that necessary metal portions, such as, for example, a portion of wall 39, are cut and removed prior to, while or after the end portions of each frame member 32 is abuttingly welded to its adjacent frame member 32.

Turning now to FIGS. 2, 3, 9–11, a linkage 75 is shown, the means by which door 20 is opened from either of its sides, against forces of attraction by magnetic member 42 acting through membrane 46 on door leaf 50. Each shielding enclosure includes a pair of linkages 75, one mounted to each door leaf 50, 76 of door 20. Except to the extent indicated below and by the drawing, the following description applies to each mounted linkage 75.

An elongated shaft or rod 77 is rotatably mounted in, in non-physical engagement with door leaves 50, 56, i.e., with the door itself, a plurality of pillow blocks 78 disposed along and securely mounted to each door leaf 50, 76, in vertical orientation. On the swing side of door 20, FIGS. 2, 3, a handle 79 is suitable secured to shaft 77, for pulling by an operator when desirous of opening door 20 (true whether swing side is exterior of or interior of enclosure 22). An eccentric cam 80 is secured to one end of shaft 77 and includes an ear 81, FIG. 3, which is situated circumferentially on shaft 77 so that as the shaft rotates in the direction of the arrow, FIG. 3, the ear engages tubing surface 73, thus thrusting door 20 on its hinges 27, 28, 29 away from its mating mode with membrane 46. Shaft 77 with cam and ear is mounted in proximity to the door's edge opposing the door's hinged edge, to obtain maximum ease of swing away from forces of attraction. It takes but an inch or inches to break such attraction. Ear 81 is secured, as by welding, to a circular ring member (not shown) secured in turn at the end of and to shaft 77. Ear 81 pushes against tubing surface 73, when handle 79 is actuated, thus making door 20 thereafter free swinging on its hinges.

Another linkage 75 is mounted likewise on the door's leaf 50 opposite leaf 76, FIG. 9. However, here an ear 83 on an eccentric cam 84 in its action pushes against a flange 85, FIG. 11, included in outer clip member 61. Flange 85 forms a space with leaf 50 of door 20 and in which space eccentric cam 84 is disposed. This push causes door 20 to swing to its swing side, on its hinges, away from membrane 46. The action of ear 83 of cam 84 results from pushing a handle 86, FIGS. 9, 10, in the direction shown by the arrow in FIG. 10, towards door leaf 50, such pushing rotating shaft 77 in the direction shown by the arrows in FIGS. 10, 11.

In operation, with door 20 in closed and sealed mode, from the swing side of enclosure 22, in this embodiment, exteriorly thereof, handle 79 is pulled by an operator. Shaft 77, cam 80 and ear 81 rotate. Ear 81 works against surface 73 of tubing 72, thereby freeing door leaf 50 from seal 35 as door 20 swings open on its hinges 27, 28, 29. From the non-swing side of door 20, here, in this embodiment, interiorly of enclosure 20, with door 20 in closed and sealed mode, handle 86 is pushed by an operator towards door leaf 50. Shaft 77, cam 84 and its ear 83 rotate. Ear 83 works against flange 85 of outer clip member 61, thereby freeing door leaf 50 from seal 35 as door 20 swings open on its hinges.

To actuate door 20 into a closed and sealed mode with seal 35, an operator grasps handle 86, interiorly of enclosure 22, to pull door 20 as it swings on its hinges into closed and sealed mode. Exteriorly, an operator pushes door 20 or handle 79 in manual conventional manner of closing a door, to push the door into closed and sealed mode.

In such operation, as door leaf 50 closes upon membrane 46, FIG. 5, resilient formations 48, 49 react to provide to-and-fro movement in pocket 33 for membrane 46 and magnetic member 42, against foam rubber member 43 which absorbs the shok of the closure. The magnetic forces of attraction in magnetic member 42 compresses leaf 50 to membrane 46 throughout the entire periphery of door frame 30, to effect the seal by which electrical conductivity flows through door 20 as well as frame 30 and enclosure 22. Eccentric cam 84 with its ear 83, FIG. 9, do not make contact with flange 85 of outer clip member 61 as the seal is effected in such closure.

It should now be apparent that in addition to the distinct seal assembly and enclosure, a novel and distinct operating mechanism for opening a door is disclosed. The door frame 30 includes surfaces 46, 73, both of which being spaced from or disposed in front of other members forming the door frame 30. With door 20 in closed mode with surface 46, a space between door 20 and one of such other members, here, flange 85 on outer clip member 61, FIGS. 6, 9, exists for the disposition of eccentric cam 84 and its ear 83 without the latter interfering with flange 85.

Copper clip member 60 represents a compressible material which crushes membrane 46 to one or the other of steel members 39, 61, as such steel members may have irregularity of flatness in their surfaces. Other materials may be used.

Door 20 is fabricated from honeycomb materials which provide improved shielding characteristics. Electrical conductivity between the skins or surfaces of door leafs 50, 76 is enhanced by the metal core of such materials. Membrane 46 is formed from brass sheet stock. The enclosure 22, walls 221, door frame members and the other salient elements of this disclosure are made of steel. The elements of the frame members are formed by utilizing metal forming brake equipment.

In assembly, walls 21 with opening 25 are fashioned in conventional manner. A shallow channel member is utilized to form pocket 33 with the addition of an L-shaped steel member which is welded as at 90, FIG. 5, along the length of each frame member 32. This fabrication forms flanges 40, 67. The respective ends of flanges 40, 67 abut corresponding ends of flanges 40, 67, as shown by flanges 40 in FIG. 7, and are welded together to constitute frame 30, keeping in mind the communication of pockets 33 from one frame member to the next, the accomplishment of which having been described above and noted here by reference thereto. Foam rubber 43 and magnetic member 42 are installed in the length of each pocket of each frame member. Brass membrane 46, performed by metal brake equipment, is set in place after which flat bar or strip 55 is secured against its segment 52 to flange 40. Clip members 60, 61, of copper and steel, respectively, are clipped onto and around wrapped segment 53, for securement to base 37 via screws 64. Tubing 72 is secured in place on flange 40 about frame 30. Door 20 is then mounted in position to frame 30, and after scrubbing proper spacing between the two, hinges 27, 28, 29 are mounted and secured to door 20 and tubing 72. This entire sub-assembly is mounted to the edges of wall 21 within opening 25 of enclosure 22. Straps 68, 69 are placed in position, FIG. 5, and secured to one another, thereby securing such sub-assembly to enclosure 22.

Various changes and modifications may be made without varying from the scope and spirit of the invention. Flange 58 of membrane 46, need not be included in all embodiments. The magnetic member 42 may be made from various known materials however, they must include high-strength magnetic characteristics. Membrane 46 may be formed in shortened pieces, and thus magnetic members 42 are correspondingly shortened to the length of each of such membranes.

I claim:

1. A seal assembly to prevent radio-frequency signals from leaking to or from a shielded enclosure system including a door frame to which the seal assembly adapts, a door swingable into a closed mode with the door frame, said door frame including a pocket for disposition for said seal assembly, said seal assembly comprising
   a magnetic member mountable in the pocket,
   a non-magnetic electrical conducting membrane formed in segments comprising
   (1) a first segment mounted contiguously to a face of said magnetic member,
   (2) spaced second segments integrally formed to said first segment and constituting resilient formations in said membrane,
   (3) a third segment integrally formed to one of said second segments,
   (4) a fourth segment integrally formed to the other of said second segments and being wrapped around the door frame forming the pocket,
   means for securing said third segment to the door frame to one side of the pocket,
   means for securing the wrapped around portion of said fourth segment to the door frame forming the bottom of the pocket, and
   means for resiliently disposing said membrane and magnetic member beyond the pocket against the action of said resilient formations.

2. The seal assembly of claim 1 wherein said securing means for the fourth segment comprises an outer clip member and an inner clip member to which said outer clip member mounts, said outer and inner clip members including terminal flanges, said fourth segment including a terminal flap, said flanges mounting upon said flap, and fasteners securing them all to the door frame forming the bottom of the pocket.

3. The seal assembly of claim 6 wherein said outer clip member is formed of steel, said inner clip member is formed of copper, and said membrane is formed of brass.

4. In an enclosure for preventing leakage of radio-frequency or electro-magnetic radiation, having a door frame with a pocket therein and a door hinged for swinging out of and into a closed and sealed mode, the door having one of its leaves engaging a seal assembly mounted across the pocket, the improvement comprising
   the seal assembly securely mounted in the pocket and having a non-magnetic electrically-conducting membrane contiguously in position over a magnetic member beyond the opening of the pocket for sealing with the one of the leaves in the closed mode,
   said membrane comprising
   (1) a first segment being contiguous over the magnetic member
   (2) spaced second segments integrally formed to said first segment and constituting resilient formations,
   (3) a third segment integrally formed to one of said second segments and being secured to the door frame to one side of the pocket, and
   (4) a fourth segment integrally formed to the other of said second segments and being wrapped around the door frame on the other side of the pocket,
   means mounted in the pocket for resiliently disposing said membrane and magnetic member beyond the pocket, and
   means mounted on each of said door's sides for opening the door against forces of said magnetic member, the first of said means including eccentric cam means for engagement against the door frame to open the door from its swing side, the second of said means including cam means for engagements with the door frame to open the door from its non-swing side.

5. In the enclosure of claim 3, the first of said opening means further including a shaft rotatably mounted on the swing side, said first cam means secured to said shaft, the second of said opening means including a shaft rotatably mounted on the non-swing side, said second cam means secured to said shaft.

6. The securely mounted manner of the seal assembly of claim 3 comprising
   fasteners attaching the third segment to the door frame to one side of the pocket and
   an outer clip member and an inner clip member to which said outer clip member mounts mounted on said fourth segment, said outer and inner clip members including terminal flanges, said fourth segment including a terminal flap, said flanges mounting upon said flap, and fasteners securing them all to the door frame forming the bottom of the pocket.

7. In the seal assembly of claim 6, said outer clip member is formed of steel, said inner clip member is formed of copper and said membrane is formed of brass.

8. In an enclosure requiring a closed mode between a door frame and door for the enclosure,
   the door frame including first and second surfaces in front of other members forming the door frame, the first surface disposed outside of dimensions of the door,
   said door engaging the second surface in its closed mode,
   a space being provided between the door in its closed mode and one of such other members forming the door frame,
   the door being swingable into its closed mode against the second surface,
   means for opening the door from its swing side comprising
   (a) a first shaft rotatably mounted on the door's swing side and in non-physical engagement with the door, and
   (b) a first eccentric cam means securely mounted to said first shaft engageable with the first of said surfaces for pushing the door out of its closed mode, and
   non-swing side opening means comprising
   (a) a second shaft rotatably mounted on the door's non-swing side and in non-physical engagement with the door, and
   (b) a second eccentric cam means securely mounted to said second shaft and disposed in said space engageable with one of such other members forming the door frame for pushing the door out of its closed mode.

9. In the enclosure of claim 8, the second surface being mounted on non-magnetic electrical-conducting member forming a part of a seal assembly for a shielded enclosure so that electrical conductivity continues between the enclosure and door when the latter is in its closed mode.

10. In the enclosure of claim 8, the one of such other members being a clip member secured to the door frame and having a flange with said second eccentric cam means forming said space, said second eccentric cam means cooperating with said flange to push the door out of its closed mode.

11. In the enclosure of claim 10, the second surface being mounted on a non-magnetic electrical-conducting member forming a part of a seal assembly for a shielded enclosure so that electrical conductivity continues between the enclosure and door when the latter is in its closed mode.

* * * * *

UNITED STATES PATENT AND TRADEMARK OFFICE
CERTIFICATE OF CORRECTION

PATENT NO. : 4,590,710

DATED : May 27, 1986

INVENTOR(S) : James F. Newland

It is certified that error appears in the above-identified patent and that said Letters Patent is hereby corrected as shown below:

In column 8, line 9, "6" is to be read as -- 2 --.

In column 8, line 29, a comma -- , -- should be read after "member".

Signed and Sealed this

Nineteenth Day of August 1986

[SEAL]

Attest:

DONALD J. QUIGG

Attesting Officer

Commissioner of Patents and Trademarks